US008748804B2

(12) United States Patent
Schweninger et al.

(10) Patent No.: US 8,748,804 B2
(45) Date of Patent: Jun. 10, 2014

(54) OPTICAL PUSHBUTTON OR SWITCH

(71) Applicant: Mechaless Systems GmbH, Bruchsal (DE)

(72) Inventors: Erhard Schweninger, Karlsruhe (DE); Michael Hase, Wiesloch (DE)

(73) Assignee: Mechaless Systems GmbH, Bruchsal (DE)

( * ) Notice: Subject to any disclaimer, the term of this patent is extended or adjusted under 35 U.S.C. 154(b) by 0 days.

(21) Appl. No.: 13/719,865

(22) Filed: Dec. 19, 2012

(65) Prior Publication Data
US 2013/0193314 A1    Aug. 1, 2013

Related U.S. Application Data

(63) Continuation of application No. PCT/EP2011/059598, filed on Jun. 9, 2011.

(30) Foreign Application Priority Data

Jul. 16, 2010   (DE) .......................... 10 2010 027 499
Apr. 14, 2011   (DE) ...................... 20 2011 000 870 U

(51) Int. Cl.
    *G06M 7/00*    (2006.01)
(52) U.S. Cl.
    USPC ..................... 250/221; 250/214 SW; 250/216
(58) Field of Classification Search
    USPC ............................. 250/214 SW, 221, 222.1, 250/227.21–227.24, 216; 340/545.6, 545.1, 340/545.3
    See application file for complete search history.

(56) References Cited

U.S. PATENT DOCUMENTS

| 5,666,037 | A | 9/1997 | Reime |
| 5,811,791 | A | 9/1998 | Portman |
| 7,589,303 | B2 | 9/2009 | Reime et al. |
| 2004/0208346 | A1* | 10/2004 | Baharav et al. ............... 382/124 |
| 2004/0208348 | A1* | 10/2004 | Baharav et al. ............... 382/124 |
| 2010/0127826 | A1* | 5/2010 | Saliba et al. ................. 340/5.82 |

FOREIGN PATENT DOCUMENTS

| DE | 10 2005 021008 A1 | 12/2005 |
| EP | 0 706 648 B1 | 4/1996 |
| EP | 0 777 327 A1 | 6/1997 |
| EP | 1 671 160 B1 | 5/2007 |
| JP | 2006-164672 A | 6/2006 |

OTHER PUBLICATIONS

DE 10 2005 021 008 A1 Machine English-Language Translation.
EP 0 777 327 A1 Machine English-Language Translation.

(Continued)

*Primary Examiner* — Francis M Legasse, Jr.
(74) *Attorney, Agent, or Firm* — Woodard, Emhardt, Moriarty, McNett & Henry LLP

(57) ABSTRACT

An optical operating element comprises a light-emitting transmitter, an optical receiver, a prism, and a cover. The prism has a side surface that is an active sensor area, and the prism is arranged below the cover such that the active sensor area is oriented substantially parallel to the underside of the cover. The cover has a sensor region which is above the active sensor area and which has a transmittance of at most 99%, at most 95%, at most 90%, at most 80% or at most 50%. Light emitted by the transmitter is guided through the prism and passes through the active sensor area and the cover. The emitted light reflected at an object enters through the sensor region and the active sensor area and is guided through the prism to the receiver. A change in reflection is identified by an evaluation circuit and is interpreted as switching.

20 Claims, 4 Drawing Sheets

(56) References Cited

OTHER PUBLICATIONS

International Application No. PCT/EP2011/059598 (published as WO 2012/007236 A1) International Search Report mailed Dec. 23, 2011.

JP 2006-164672 A Machine English-Language Translation.
International Patent Application PCT/EP2011/059598 International Preliminary Report on Patentability mailed Jan. 22, 2013.

* cited by examiner

OPTICAL PUSHBUTTON OR SWITCH

CROSS-REFERENCE TO RELATED APPLICATION

This application is a continuation of International Application No. PCT/EP2011/059598 filed Jun. 9, 2011, which claims the benefit of German Patent Application No. 20 2011 000 870.3, filed Apr. 14, 2011, and which also claims the benefit of German Patent Application No. 10 2010 027 499.2 filed Jul. 16, 2010, which are hereby incorporated by reference in their entirety.

BACKGROUND

The present invention relates to an optical operating element, more particularly a pushbutton or switch, comprising a light transmitter, an optical receiver, a prism suitable for guiding light, and having a cover that is impermeable to radiation and has a least one exit aperture.

Contact switches or pushbuttons that trigger a switching operation in a device when touched by the user are used widely in many electronic devices, such as mobile phones, remote control devices, domestic appliances and lifts, as well as in the automotive industry. Both capacitive and optical switches are known for this function. Capacitive contact switches have a sensor surface that as part of a capacitive sensor element generates a capacitance in conjunction with the user, which changes correspondingly when touched. The sensor surface is usually coupled via a measuring electrode with a circuit arrangement that feeds a corresponding output signal to an evaluation circuit. From this, a determination may be made as to whether the contact sensor is being touched or not.

However, capacitive measuring methods have only small ranges, and are essentially limited to direct contact. If the range of this sensor is increased, the sensors usually respond incorrectly or at least unbidden to moisture, temperature changes or stray electromagnetic radiation. Moreover, these sensors do not work when surrounded by conductive surfaces such as metal or metalized surfaces.

Besides capacitive operating elements, optical elements are also known, and in these the reflection of light in the visible or invisible range, particularly the infrared range is used. Thus, it is possible to detect not only contact, but also the approach of an object, a finger for example, by detecting and evaluating changes in the quantity of reflected light. By analyzing the reflected light, a change in the reflected light is detected, and this then triggers switching or similar operation. Although the operating elements based on optical measuring methods have a greater range, they also often have the disadvantage of being susceptible to interference by extraneous light. They also require a certain installation space behind the user interface for locating the sensors (photoreceivers). They always require a user interface that is translucent to the extent that sufficient light is radiated and a sufficiently large fraction of reflected light can be received and forwarded to the optical sensor.

Optical sensors preferably use LEDs as light sources and light sensors. Photodiodes or photoelements are used as receivers. The sensitivity of photodiodes to modulated light is dependent on absolute brightness, and this dependence is called the ambient light effect. Accordingly, the received signal of a reflection light barrier depends not only on the degree of reflection that is to be measured, but also on the ambient light. It is not possible to evaluate the received signal reliably if the ambient light conditions are too variable. Document JP 2006-164672 A describes an optical sensor that is arranged behind a mirror. The mirror has a certain number of apertures in the silver film thereof, behind which an optical prism is arranged to guide the light and illuminate the sensor. The optical sensor is disposed in such manner that light is emitted directly through one of the apertures in the silver film, and the light reflected by an approaching object is received by a receiver positioned directly behind the aperture. The emitter and the receiver are arranged side by side, which results in crosstalk and the sensitivity of the sensor is impaired to such a degree that an object approaching the sensor cannot be detected reliably.

A measuring method is known from EP 0 706 648 B1 in which the transmission function of the photodiode is eliminated. At least two light sources alternate in transmitting light to at least one receiver. The light sources are controlled in such manner that from the viewpoint of the receiver they are constantly equally bright. Consequently, the signal received by the photodiode is of equal magnitude for both signals. If the two light sources transmit oppositely phased rectangular light signals, adjustment of the measurement path yields a received signal of zero. The consequence of this is that the receiver amplification may be almost infinite since only the receiver signal filtered by a band-pass is evaluated. If one of the light sources is too strong, the subsequent circuit detects this fact and readjusts the intensity of the light source accordingly until the differential signal of the two light sources at the receiver is equal to zero again.

Document EP 1 671 160 B1 discloses a method for determining and evaluating a differential optical signal. This method is based on EP 0 706 648 B1 and also comprises a compensation light source for introducing the adjustment value back into to the adjustment path.

The optical sensors based on reflection always require the use of a sensor surface through which a sufficient fraction of the light is able to escape. In the related art, there is a substantial need for optical operating elements in which the sensor surface that serves as the functional surface or pushbutton surface only has a very low light transmittance. This may be because, for example, materials with low transmittance or materials that have large ranges of dispersion are used, with the result that a light beam that is reflected outside of the material can no longer be evaluated. For aesthetic reasons as well, there is often a requirement to use sensor surfaces that have an overprint or a mask with a cutout. For example, sensor surfaces made from metal panels, metalized foils or with vacuum metalized surfaces in which characters or symbols are cut out are used. There are also surfaces that have been painted and on which symbols are visible due to mask formation. These cutouts or masks in the impermeable surfaces allow light to exit. But they are often very small, which means that the conventional optical measuring methods, which are based on reflection, cannot be used, because the attenuation values of the sensor surfaces themselves are too high. Moreover, such operating surfaces are often not suitable generally for capacitive measuring methods or other measuring methods. It is also often intended that the buttons should be illuminated by a light source from behind, so that the shape of the cutout is illuminated on the surface.

SUMMARY

The object of creating improved optical operating elements based on the reflection measuring method and comprising light-impermeable surfaces with small masking areas has emerged from the related art.

The present object is solved with an optical operating element having the features of claim 1 and a method according to claim 18.

The operating element according to the invention, which may particularly be a switch or a pushbutton, comprises a light-emitting light transmitter, an optical receiver, a prism suitable for guiding light, and a cover. The prism has a side surface that is an active sensor area, and is arranged below the cover in such manner that the active sensor area of the prism is oriented substantially parallel to the underside of the cover. The area of the cover that is arranged above the active sensor area and corresponds to the active sensor area of the prism is the sensor region of the cover. This sensor region of the cover has a transmittance of at most 99%. The transmittance is preferably not more than 95% or not more than 90%, particularly preferably not more than 80% or not more than 50%.

The cover itself preferably has a low transmittance, not exceeding 20%, not exceeding 15% or not exceeding 10%, preferably not exceeding 5% or not exceeding 2%. It may also be substantially impermeable to radiation and then preferably has at least one exit aperture so that the entire transmittance of the cover including the outlet openings has the values indicated in the preceding. The light transmitter may be a light source, for example an LED. The optical receiver is preferably a light sensor, such as a photodiode. The light transmitter and the receiver work with light in the visible or invisible range, for example the infrared range.

The term "active sensor area" is understood to mean the area that is used for optical evaluation. The measuring light is emitted through the active area and the measuring light reflected from the object to be detected enters the prism through the active area. The active sensor area preferably constitutes the entire side surface of the prism.

The term "prism suitable for guiding light" is understood generally to mean an optical body, the interior of which is suitable for propagating light. The signal prism (prism) does not diffuse the light, so the light that is fed into the prism is guided in a straight line from one boundary surface to an opposite boundary surface inside the prism and—depending upon the angle of incidence thereof with the boundary surface—is reflected or transmitted therein. Glass bodies or dimensionally form stable plastic bodies are particularly suitable for use as prisms.

The cover is made from a material having low transmission, for example a "black panel material" or a corresponding plastic material. A dyed material or a highly diffusive material having only a small or negligible transmissive fraction may also be used. The cover is preferably made from a light-impermeable material such as sheet metal, a vacuum metalized foil or metalized foil, or a varnished foil. At least one exit aperture is preferably created in the cover, so that light is able to exit through this exit aperture in the cover.

The prism is arranged below the cover in such manner that the boundary surface of the prism is aligned substantially parallel with the cover. The light transmitter is arranged relative to the prism in such manner that radiated light is guided through the prism and exits at the boundary area adjacent to the cover, so that the light is able to be transmitted through the cover or, if present in the form of a preferable different embodiment, through the exit aperture in the cover.

Outside of the operating element, the exiting light is reflected by an object, a finger for example, so that the reflected light fraction is guided back into the prism through the cover or the exit aperture. The receiver is arranged in such manner that the light reflected by the object outside of the operating element passes through the prism and is guided to the receiver. A change in this reflection is interpreted as switching in a connected evaluation circuit.

In this context, it is advantageous that the cover itself may have the desired shape and a light-impermeable surface. The cover may be highly diffusive. An important point, however, is that the prism used must not be diffusive and that it must guide the light beam substantially in a straight line.

If the operating element is to be backlit, the optical operating element comprises a diffuser element, which is used to scatter irradiating light. This ensures that the entire exit aperture of the cover is irradiated with light as evenly as possible. In this way, it is possible to irradiate the exit aperture in such manner that the button and the optical operating element respectively may also be detected in the dark.

In a preferred embodiment, the cover has a plurality of exit apertures. In this context, the exit apertures are selected in such manner that the sum of the aperture areas thereof is significantly smaller than the area of the cover of the optical operating element. Thus, the total area of all exit apertures is significantly smaller than the area of the boundary area (side surface) of the prism that is adjacent to the cover. The sum of the aperture areas of the exit apertures is preferably at most 50 percent of the area of the cover or the boundary area of the prism, particularly preferably at most 30 percent, not more than 20 percent, or not more than 10 percent.

Embodiments in which the sum of the exit apertures has an area equal to not more than seven percent of the area of the cover are also preferred. The optical operating element according to the invention is still able to function reliably when the sum of the aperture areas is at most 5 percent, preferably not more than 3 percent, particularly preferably not more than 2 percent of the area of the cover. Under certain circumstances, this ratio may even be not more than 1 percent or 0.5 percent.

Given a base area of 10 mm×10 mm (100 mm2) for the cover, the total area of all exit apertures is preferably not more than 10 mm$^2$, 7 mm$^2$, 6 mm$^2$, 5 mm$^2$, 3 mm$^2$, 2 mm$^2$ or 1 mm$^2$. The operating element according to the invention still functions reliably even with these aperture areas and at all events detects a directly contacting object. With such aperture areas, the total transmittance of the cover including the exit apertures is not more than 20% to not more than 5%, in some cases even less, for example not more than 3%, 2% or 1%. The operating element according to the invention works reliably even then.

The exit apertures in the cover are designed such that at least one of the exit apertures is in the shape of a symbol, a numeral, a letter or a pictogram. It is also possible that a plurality of exit openings together form a symbol, a numeral, a character or a pictogram. It is also conceivable for a plurality of letters to be formed by single or multiple exit apertures. For example, the pictograms or symbols, or even abbreviations such as ABS, DTC, ESP and similar used commonly in the automotive field may be created by single or multiple exit apertures.

In order to backlight these buttons particularly in the automotive field, the exit aperture is illuminated by a diffuser element. For this purpose, the light emitting light sensor (transmitter) may be used if it emits light in the visible range. Usually, however the light transmitter will function in the infrared, or at least in the invisible wavelength range, rendering it unsuitable for use in backlighting. In this case, an additional light source is preferably provided, which illuminates the diffuser element in such manner that the button is backlit. The color of the backlighting may be adapted to reflect the customer's wishes. It is also possible to use multiple light sources for backlighting. Light sources that change color through targeted control are also conceivable. For example, the color of the button might change when approaching of an object such as finger towards the optical operating element is detected.

In a preferred embodiment, the diffuser element is arranged in such manner that the light guiding prism is located between the cover and the diffuser element. The diffuse light that exits the diffuser element is then forwarded in a straight line through the prism, thereby guaranteeing that the exit apertures and the symbols represented, respectively, are illuminated evenly. The backlighting does not interfere with the actual measurement. As was stated earlier, it may even be the measuring signal or a part of the measuring signal.

In a preferred embodiment, the prism is in the shape of a wedge. For example, the prism may be understood to be an optical special form of the geometric body "prism". In that case, it is a straight prism with a triangular base area. An alternative, also preferred, is a prism in the shape of a wedge. In this case, a prism is preferred in which two boundary areas of the prism enclose an angle of 90 degrees. The base area of the prism is particularly preferably an isosceles right-angled triangle.

One of the boundary areas on the wedge-shaped prism is preferably arranged parallel to the cover. The second boundary area of the prism, connected thereto at an angle of 90 degrees, extends perpendicularly away from the cover. The transmitter and/or the receiver are arranged on the side of this boundary area. Preferably, both the transmitter and the receiver are arranged on this side. The transmitter and the receiver are preferably arranged side by side or one above the other. This also provides the capability of keeping the construction depth of the operating element small, since the optical operating elements do not have to be placed underneath the exit apertures.

In a preferred embodiment, the optical operating element has a compensation light source, which is preferably configured as a compensation LED. The evaluation circuit preferably comprises a compensation circuit. In a preferred embodiment, the compensation LED is arranged on a side of the prism that is arranged at a 90-degree angle to the cover and at a 90-degree angle to the boundary area that is adjacent to the receiver and the transmitter. The compensation light source is positioned relative to the receiving diode (photodiode) in such manner that it irradiates the photodiode indirectly. By comparing the light emitted by the light transmitter and reflected from an object with the light received from the compensation light source, an adjustment may be made that compensates for and adjusts the transmission function of the photodiode. This method is described in greater detail in EP 1 671 160 B1 and EP 706 648 B1. To this extent, the content of the cited patents is included in the object of this description.

Since the exit apertures in the cover are small, the sensor must be extremely sensitive, and the measuring arrangement comprising the light transmitter and the photodiode must have a low basic coupling, respectively "basic coupling" is understood to mean the portion of the light that does return from the light transmitter to the optical receiver, and is thus received and evaluated if there are no objects outside of the operating element. Since most of the optical measuring signal (light emitted by the transmitter) only passes through the prism, which is non-diffusing, and does not have to pass through any further strongly diffusing layers, as is the case in other known approaches to solve the problem, this basic coupling may be kept low. This is the only way to achieve the high sensitivity that is essential in order to be able to resolve the minimal changes in the functional light signal.

In the context of the invention, it was found that it is possible to improve the basic coupling by appropriate treatment of the inner rear side of the cover, that is to say the surface of the cover that is adjacent to the prism. For this purpose, the inner rear side is treated such that a little of the signal as possible is reflected and returned to the photodiode. The entire portion of emitted light used for the measurement that does not escape to the outside through the exit apertures should be absorbed as completely as possible, or at least not reflected towards the photodiode. To this end, the rear side of the cover may be roughened, provided with a backing or adhesive layer, or painted.

BRIEF DESCRIPTION OF THE DRAWINGS

The invention will hereafter be explained in greater detail with reference to the particular embodiments in the figures. The special features shown therein may be used individually or in combination to create preferred variations of the invention. The configurations described do not represent a limitation of the invention defined by the totality of the claims. In the Figures:

DETAILED DESCRIPTION

Figure 1A:
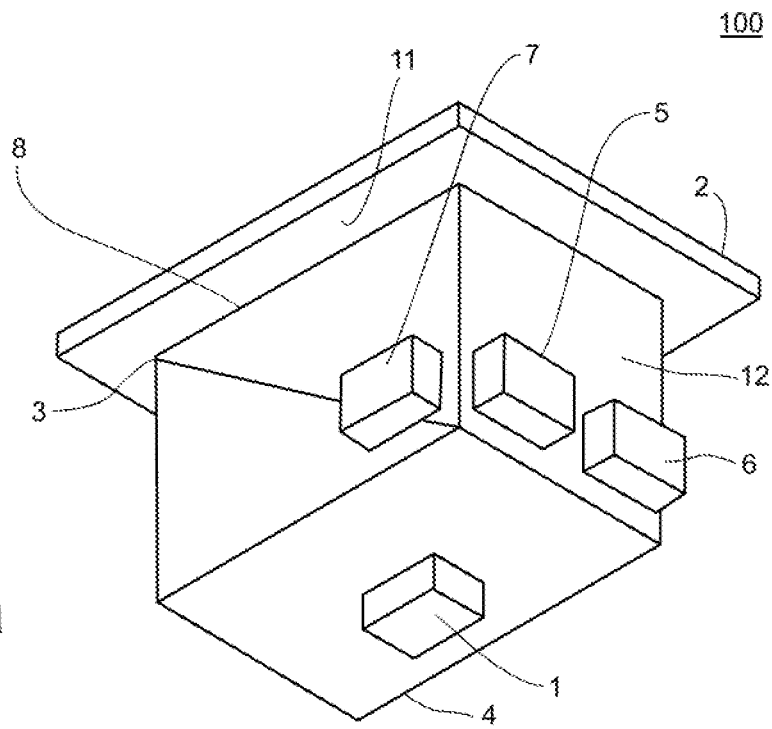
FIGS. 1a-c show detail views of an operating element with the prism and diffuser element.
Figure 1B:
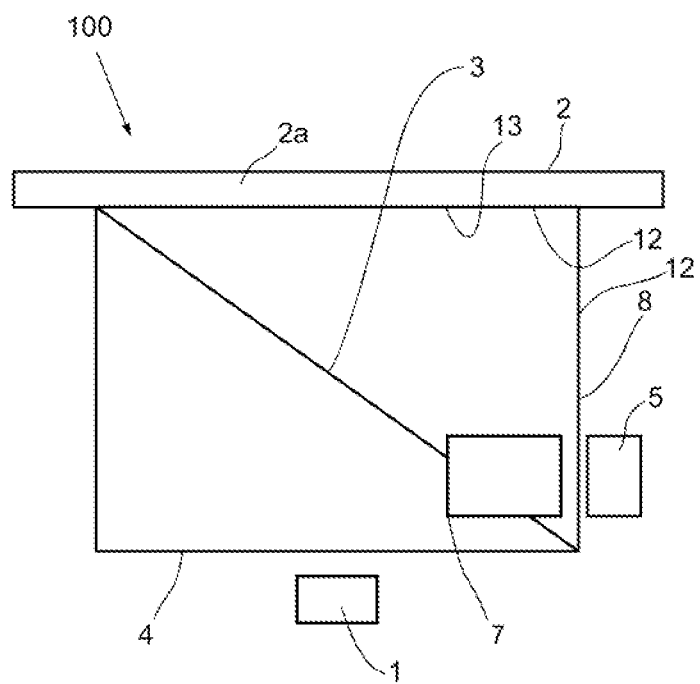
Figure 1C:
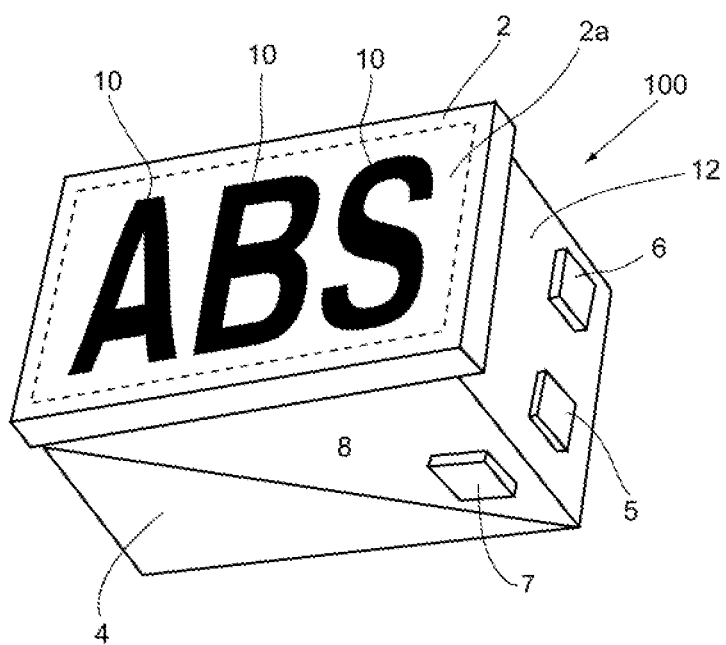

FIGS. 1a to c show an optical operating element 100 with a cover 2 that, according to FIG. 1c has a plurality of exit apertures 10. The exit apertures 10 form the word ABS and are typically used in the automobile industry or automotive sector.

A prism 8, constructed as the signal prism, is arranged on underside 11 of cover 2. Signal prism 8 is wedge-shaped, having to two side surfaces 12 that enclose a right angle. One of side surfaces 12 is an active sensor area 13. The entire area of sensor area 12 is thus active sensor area 13. It is adjacent to cover 2. This side surface 12 (active sensor area 13) is located parallel to underside 11 of cover 2. Cover 2 preferably lies with the underside thereof against side surface 12 of prism 8. Consequently, the two areas are in contact. The area of the cover that corresponds to active sensor area 13 is sensor region 2a of cover 2. The surface area of sensor region 2a is the same size as the surface area of active sensor area 13. Sensor region 2a serves to transmit light and to receive the transmitted light that is reflected from an object. Sensor region 2a is thus the area that preferably lies against sensor area 13.

Light transmitter 5, which has the form of a transmitter LED, and receiver 6, which has the form of a photodiode, are arranged on second side surface 12. Light that is transmitted through the prism by transmitter LED 5 is reflected from boundary surface 3 and directed towards cover 2 inside prism 8. At cover 2, it exits through exit apertures 10, which are preferably all arranged in sensor region 2a of cover 2, and may be reflected by an object located outside the operating element 100 or by an object approaching the operating element 100. The reflected light enters active sensor area 13 of signal prism 8 through exit apertures 10 in cover 2 and is also reflected by boundary surface 3 in such manner that it is directed toward photodiode 6. Based on a change of the reflection from the object, an evaluation circuit, not shown here, detects that an object has approached, for example in such manner that cover 2 is touched from the outside. This change is interpreted and evaluated by the evaluation circuit as an actuation of the operating element. Depending on the embodiment of the operating element, it may function as a pushbutton or a switch.

A compensation light source 7, which is designed as a compensation LED, is positioned on one of the inclined side surfaces of wedge-shaped signal prism 8. Compensation LED 7 transmits light that is received indirectly (and correspondingly attenuated) by photodiode 6. So, the summed (net) received signal (from the compensation LED and the transmitter LED) is corrected to zero by comparing and controlling the compensation LED and the transmitter LED. In this context, the light transmitted by the compensation LED is phase-offset by 180 degrees relative to the light emitted by the transmitter LED. So, it is possible to compensate the transmission function of photodiode 6 and of the subsequent amplifier and of the evaluation circuit, both not shown here.

Operating element 100 according to the invention has the advantage that, besides the non-diffusive signal prism 8, a diffuser element 4 is also present, and in the embodiment shown in FIG. 1 has the form of a wedge-shaped lighting diffuser 4. An illumination source 1, which is a light source, transmits light into illumination diffuser 4. The light is diffuse when it exits active sensor area 13 and exit apertures 10 of cover 2. In this manner, the entire exit aperture area is evenly illuminated. Thus it is possible to produce an illuminated button so that the exit apertures 10 designed as symbols or icons may be visible.

Since diffuser element 4 is arranged below signal prism 8, the optical path of the measuring light emitted by the transmitter LED is not obstructed by scattering media.

Figure 2:
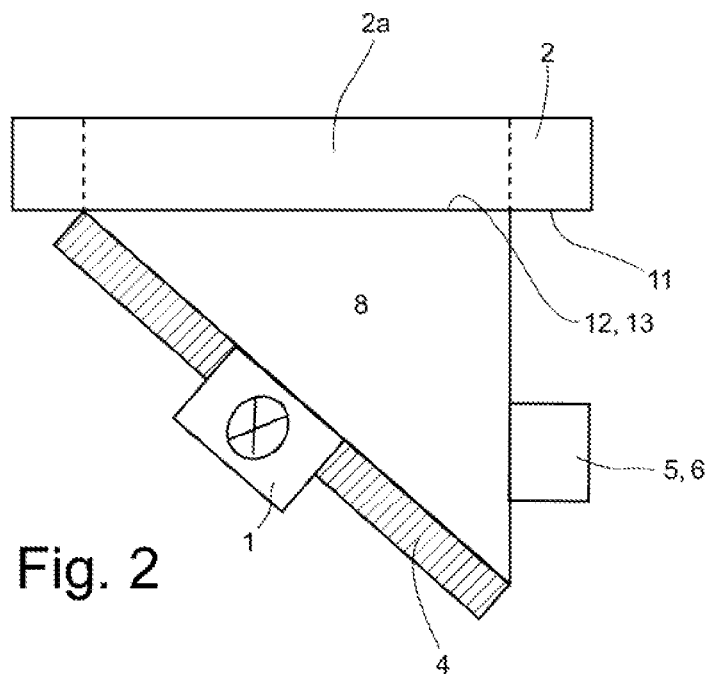
FIG. 2 shows an alternative embodiment of the operating element with diffuser element.

FIG. 2 shows a cross section through operating element 100 with a wedge-shaped signal prism 8, a cover 2 with sensor region 2a and a diffuser element 4. Cover 2 touches with its sensor region 2a the side surface 12 that forms active sensor area 13. In this case, diffuser element 4 is arranged as a parallel plate (rectangular solid) and contacts boundary surface 3 of signal prism 8. Light source 1 is arranged below diffuser element 4. Such a diffuser element is usually sufficient to evenly backlight the button and the symbols created on the button in the form of exit apertures 10. With a diffuser element 4 that is not wedge-shaped, the light source 1, which is preferably also an LED, may be positioned with minimum space requirement.

Figure 3:
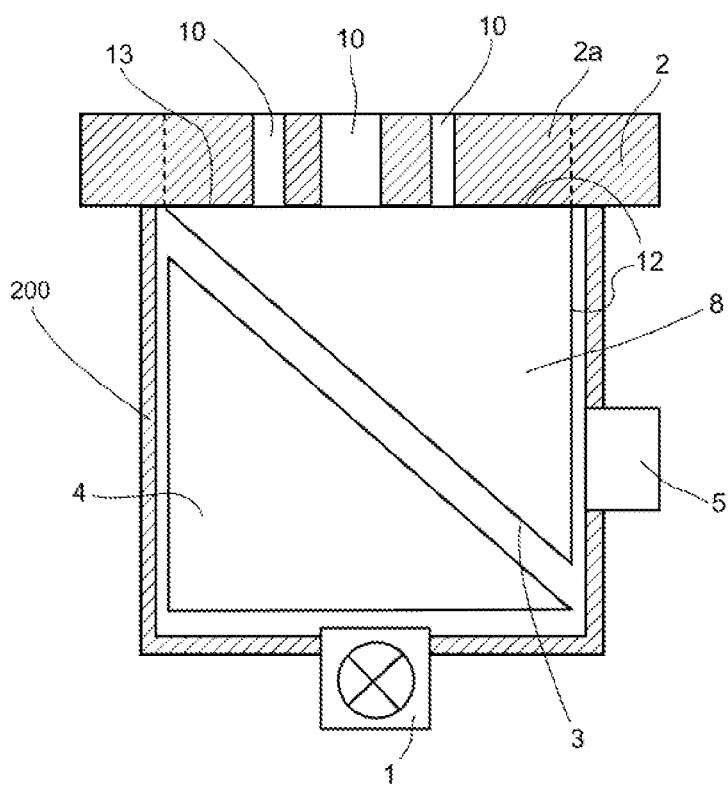
FIG. 3 shows another alternative embodiment of the optical operating element.

FIG. 3 shows a cross section of a refinement of the operating element 100 of FIG. 1 designed as a pushbutton. Operating element 100 is arranged in an encapsulation 200, which is preferably in the form of a cuboid or cube, both are open at the top. An aperture is provided on the underside, through which light from illumination source 1 may be radiated into diffuser 4. Apertures are provided on one of the sides. Light transmitter 5 and optical receiver 6 are arranged behind the apertures. The light from transmitter LED 5 is transmitted into signal prism 6 through these apertures, and the reflected light is received by photodiode 6 behind the corresponding aperture. A further aperture is provided on a side not shown here, behind which compensation LED 7 is positioned to transmit light directly to photodiode 6.

In the cross-section of FIG. 3, operating element 100 is cut in such manner that cover 2 is revealed in the region of exit apertures 10. The individual exit apertures 10 that form an icon, a symbol, or one or more letters are clearly visible on the upper side.

In summary, the technical object to be solved and the solution elements as well as the individual advantages of the operating element according to the invention are presented again. In so doing, reference is made to the HALIOS method, which is described in the European patents EP 1 671 160 B1 and EP 706 648 B1 cited in the preceding. The HALIOS method comprises a compensation method for compensating the transmission function of the photodiode and of the measuring and compensation circuit. Further details may be obtained from the corresponding patents. The HALIOS chip is an electronic chip manufactured by the Elmos company that is marketed under the protected name "HALIOS".

The present invention relates to the detection of an object, particularly a hand or finger, when a sensor surface (button) is touched, and even before it is touched, that is to say at some distance from the sensor surface. This is called predetection in the forefront. In this manner, it is possible to activate button functions, and where applicable to control backlighting (selectively if desired). For example, the brightness of the backlighting may be increased or dimmed as soon as a finger is approached towards the button.

Thereby, the light transmission of the relevant functional surface or button surface is low to very low, either due to the use of materials with low measuring light transmission and/or high scatter values and/or small transmissive (particularly IR-transparent) areas (exposed areas) in the button generally. The sensor surface (the sensor cover) may be furnished with an overprint or a cutout/mask (letter, number symbol . . . ), wherein particularly sheet metal panels, (metalized) foils, vacuum metallization, paints, or even black panel materials may be used, whose attenuation values are too high for conventional optical measuring methods or which are fundamentally unsuitable for other measuring principles (such as capacitive methods). The information to be gained, whether or not an object is present, is range information based on the degree of reflection. This information is obtained correctly even if the surface is illuminated from the rear. Backlighting does not interfere with the measurement; it may even be the measuring signal or part of the measuring signal. It is also possible to arrange or combine a relatively large number of buttons in a (variously shaped) field and to activate all functions simultaneously with a single HALIOS® chip (possibly together with a HALIOS® pre-amplifier).

Highly sensitive, backlit HALIOS symbol button with low height:

The passive optical components used, which are used for optical reflection, optical coupling and diffuse background lighting, include a clear or tinted but in any case not diffusing signal prism and an illumination diffuser. In FIGS. 1a-1c these are components 8 and 4. The components for detection (measuring function) comprise—according to the HALIOS method—a transmission LED 5, a compensation LED 7 and a receiver diode 6. Transmission LED 5 and receiving photodiode 6 are—as shown in the drawing—arranged at the signal prism in such manner that the radiation/reception lobe (optical fields of view thereof), deflected by total reflection, overlap almost completely at the sensor surface and cover 2, respectively, wherein the sensor surface and cover 2, respectively, is fully lit from behind. By appropriate positioning of the compensation LED 7 on the signal prism, compensation LED 7 is also integrated with the adequate optical coupling in the HALIOS control loop in order to guarantee the necessary sensitivity (resolution) of the sensor (among other effects). The lighting diffuser (for example wedge- or plate-shaped) mounted below the signal prism is irradiated from the rear thereof by an illumination source 1, forwards this illumination through (non-diffusive) signal prism 8 to the surface (symbol area) so that finally this area is (diffusely) backlit and made visible. Depending on the requirements with regard to coloring, intensity, appearance when switched off, and design questions in general, and activation period as well, lighting diffuser 4 and separate, "discrete" light source 1 (alternatively, a plurality thereof) may also be combined in a single, large-area lighting element, for example with a suitable (already independently and homogenously luminous) O-LED (organic LED).

High sensitivity of the operating element according to the invention through reduction of basic coupling:

Since for the most part the optical measuring signal then only passes through the (non-diffusive) signal prism (and no longer has to pass through strongly scattering layers, as in other approaches), the basic coupling may be kept low. This is the essential prerequisite for the intended high sensitivity, so that the minimal changes in the functional signal may be resolved. The requirement for low basis coupling implies that the (inner) rear side of the symbol surface must return as little (basic coupling) signal to the photodiode as possible. This means that all transmitted measuring light that does not escape to the outside through the exit aperture of the symbol surface, must be absorbed as completely as possible or at least not reflected towards the photodiode. For this purpose, the rear of the symbol must be treated appropriately (roughened, provided with a backing or adhesive layer, painted). Sufficiently homogenous illumination of the symbol surface with background light and measuring light equally. This enables lower construction heights. The spatial separation of the components for backlighting from those associated with measuring eliminates the (geometrical) space constraint that would exist in an arrangement of all components below the symbol surface (that is to say without the signal prism). The various components would obstruct, overshadow, or even interfere with each other (optically, electrically) and it would be impossible to position them optimally. These spatial conflicts could only be mitigated with larger construction heights. In turn, larger construction heights result in longer light paths through scattering media and/or less favorable angles (because they produce basic coupling) and so on.

Figure 4A:
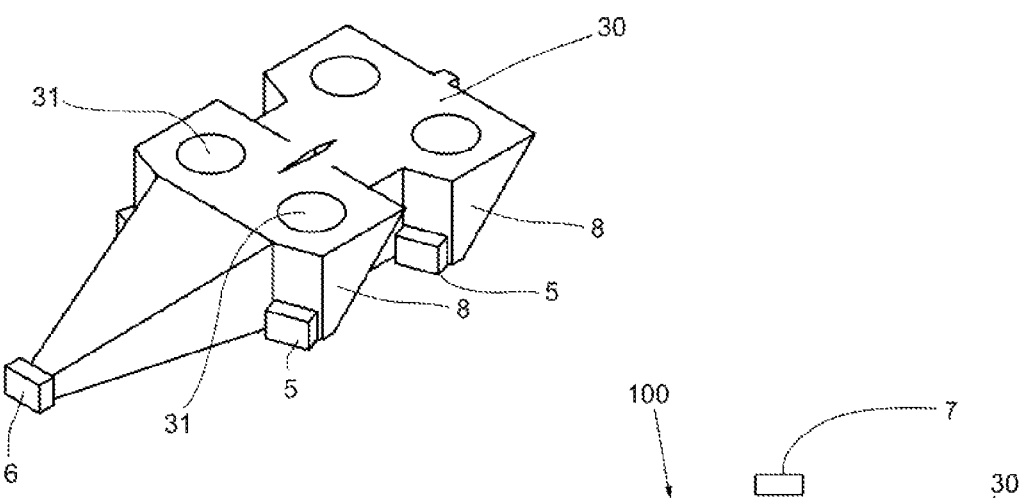
FIGS. 4a, 4b, and 4c show an embodiment of the operating element having a total of four buttons, each of which has at least one exit aperture.
Figure 4B:
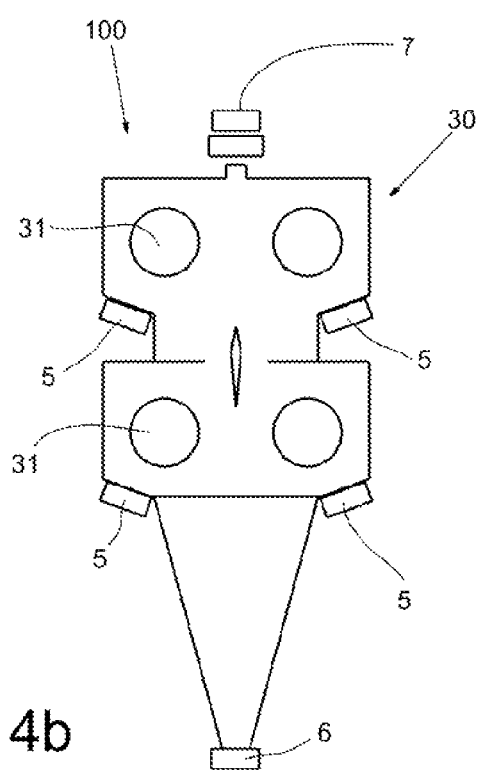
Figure 4C:
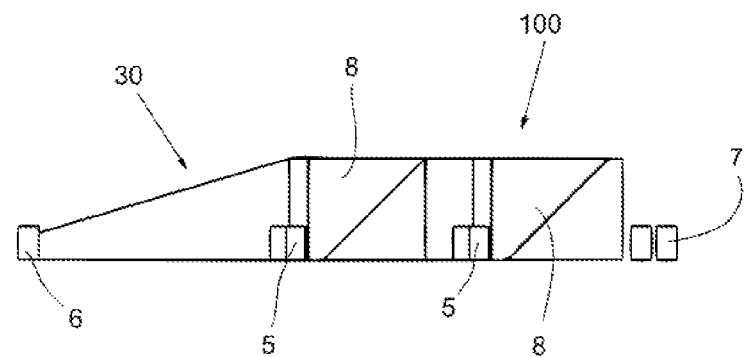

If cover 2 comprises a plurality of buttons, each of which has a least one exit aperture, light from a first transmitter is able to exit through a first exit aperture and light from a second light transmitter is able to exit through a second exit aperture. FIG. 4 shows an embodiment of operating element 100 according to the invention having a keypad with a total of 4 buttons. Each of the buttons may have one or more exit apertures 10 in cover 2, representing a symbol, a letter, a character, a number or a pictogram. By providing a plurality of the (individual) button functions described in the preceding within a monolithic or modular light guide structure 30, a keypad (switch array) is produced that may be evaluated entirely and simultaneously by a (single) HALIOS chip. So, the number of transmitting LEDs 5 (and backlighting sources) exactly matches the number of button functions. Light guide structure 30 is constructed in such manner that one prism 8 is positioned below each button 31 and (visible or invisible) light emitted by transmitter LED 5 is guided to the button 31 or through exit aperture 10 of the respective button cover. Light that is reflected by an object is fed into light waveguide 30 by prism 8 in such manner that it is directed to photodiode 6. Photodiode 6, compensation LED 7 and the HALIOS chip only have to be present once for each (complete) switch array. The switch array of 2×2 buttons illustrated for exemplary purposes in FIG. 4 may be varied in many different ways.

Various button arrangements are possible, for example linear, curved, arc-shaped, variously designed surfaces (covers) or arrays, and so on. Depending on the predefined boundary conditions (geometry, sensitivity, response time), the number of channels (buttons) evaluated by a single HALIOS chip may be increased to eight or twelve by multiplexing, possibly using a (HALIOS) preamplifier.

The invention claimed is:

1. An optical operating element, particularly a pushbutton or switch, comprising a light radiating light transmitter, an optical receiver, a prism suitable for guiding light, a compensation light source positioned along the prism to transmit light through the prism to the optical receiver to compensate for a transmission function from the light transmitter to the optical receiver, and having a cover, characterized in that the prism has a side surface that is an active sensor area,
the prism is arranged below the cover in such manner that the active sensor area of the prism is oriented substantially parallel to the underside of the cover,
the cover has a sensor region that is the region of the cover above the active sensor area and which has a transmittance of at most 99%, at most 95%, at most 90%, at most 80% or at most 50%,
the prism and the light transmitter are arranged in such manner that the light emitted by the light transmitter is guided through the prism and passes through the active sensor area and the cover,
the receiver is arranged in such manner that the transmitted light that is reflected from an object and enters the active sensor area through the sensor region of cover is guided to the receiver and a change in the reflection is detected by an analyzing circuit and interpreted as switching.

2. The optical operating element according to claim 1, characterized in that the cover is light-impermeable and has at least one exit aperture through which emitted light can pass, wherein the exit aperture of the cover has an aperture area at least 50% smaller than the area of the cover and the light transmitter and the prism are arranged in such manner that the light from the light transmitter exits through the at least one exit aperture.

3. The optical operating element according to claim 1, characterized by a diffuser element for scattering irradiated light, wherein light that is irradiated light into the diffuser element exits in diffuse manner through the exit aperture of the cover and enables backlighting of the optical operating element.

4. The optical operating element according to claim 1, characterized in that the cover has a plurality of exit apertures.

5. The optical operating element according to claim 1, characterized in that the sum of the aperture areas of the exit apertures does not exceed 30 percent of the area of the cover, preferably does not exceed 20 percent, 10 percent, 7 percent, 5 percent, 3 percent or 2 percent.

6. The optical operating element according to claim 1, characterized in that the sum of the aperture areas of the exit apertures is not greater than 10 mm$^2$, 7 mm$^2$, 5 mm$^2$, 3 mm$^2$ or 2 mm$^2$.

7. The optical operating element according to claim 1, characterized in that at least one of the exit apertures has the form of a symbol, a number, a letter or a pictogram.

8. The optical operating element according to claim 1, characterized in that at least two exit apertures together represent a symbol, a letter, a number or a pictogram.

9. The optical operating element according to claim 1, characterized by an additional light source for illuminating the optical operating element, wherein the light source is arranged in such manner that the light emitted thereby is scattered diffusely in the diffuser element and then guided through the prism to the exit aperture in the cover.

10. The optical operating element according to claim 1, characterized in that the light emitting light source is used to backlight the optical operating element, wherein preferably a portion of the light transmitted by the light transmitter is scattered diffusely in the diffuser element before the scattered portion of the light exits through the exit aperture of the cover.

11. The optical operating element according to claim 1, characterized in that the prism is arranged in the form of a wedge, wherein one of the side surfaces is aligned substantially parallel to the cover and preferably the light transmitter and/or the optical receiver is arranged on one of the sides of the wedge-shaped prism.

12. The optical operating element according to claim 1, characterized in that the compensation light source is in the form of an LED.

13. The optical operating element according to claim 1, characterized in that it comprises a plurality of light transmitting light transmitters.

14. The optical operating element according to claim 1, wherein the compensation light source is arranged on a side of the prism that is arranged at a 90-degree angle to the cover and at a 90-degree angle to a boundary area that is adjacent to the light transmitter and the optical receiver.

15. The optical operating element according to claim 11, characterized in that the prism is a straight prism with a triangular base area, wherein two side surfaces enclose a right angle, and one of these side surfaces is arranged parallel to the cover, and the light transmitter and/or the optical receiver is/are arranged on the other of these side surfaces.

16. The optical operating element according to claim 12, characterized in that the evaluation circuit comprises a compensation circuit with which it is possible to detect the position and/or movement of an object in the vicinity of the exit aperture of the cover.

17. The optical operating element according to claim 13, characterized in that the cover comprises a plurality of exit apertures and light from a first light transmitter exits through a first exit aperture and light from a second light transmitter exits through a second exit aperture.

18. The optical operating element according to claim 17, characterized in that the transmittance of the cover is not more than 20%, not more than 15%, not more than 10%, not more than 5% or not more than 2%.

19. A method for detecting a movement and/or position of an object by optoelectronic means with an optical operating element according to any one of the preceding claims, comprising the following steps:
    emitting a light beam by at least one light transmitter,
    emitting a compensation light from at least one compensation light source,
    guiding the emitted light through prism and exit aperture of the cover, wherein the light passes through the exit aperture,
    receiving light that is returned through the exit aperture as a consequence of an object moving or positioned outside the operating element in the vicinity of the exit aperture,
    guiding the reflected beam through prism to optical receiver,
    compensating for the transmission function from the light transmitter to the optical receiver by receiving the compensation light with the optical receiver,
    evaluating the optical input signal at the receiver by means of an evaluation circuit for determining the movement and/or position of the object.

20. The method of claim 19, further comprising:
    controlling the light transmitter and the compensation light source so the summed received signal at the optical receiver is corrected to zero.

* * * * *